United States Patent
Ku et al.

(10) Patent No.: US 10,402,207 B2
(45) Date of Patent: Sep. 3, 2019

(54) VIRTUAL CHASSIS MANAGEMENT CONTROLLER

(71) Applicant: Quanta Computer Inc., Taoyuan (TW)

(72) Inventors: Kai-Fan Ku, Taoyuan (TW); Chin-Fu Tsai, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 26 days.

(21) Appl. No.: 15/184,587

(22) Filed: Jun. 16, 2016

(65) Prior Publication Data

US 2017/0364375 A1    Dec. 21, 2017

(51) Int. Cl.
*G06F 9/445* (2018.01)
*G06F 13/40* (2006.01)
*G06F 13/362* (2006.01)
*H05K 7/14* (2006.01)

(52) U.S. Cl.
CPC ........ *G06F 9/44505* (2013.01); *G06F 13/362* (2013.01); *G06F 13/4027* (2013.01); *H05K 7/1498* (2013.01)

(58) Field of Classification Search
None
See application file for complete search history.

(56) References Cited

U.S. PATENT DOCUMENTS

| | | | | |
|---|---|---|---|---|
| 2005/0080887 A1* | 4/2005 | Lee | ............... | G06F 11/2025 709/223 |
| 2012/0076003 A1 | 3/2012 | Wong | | |
| 2012/0134085 A1 | 5/2012 | Gau et al. | | |
| 2012/0136501 A1* | 5/2012 | Gau | ............... | H05K 7/1498 700/300 |
| 2013/0173810 A1 | 7/2013 | Subramaniam | | |

(Continued)

FOREIGN PATENT DOCUMENTS

| CN | 104615506 A | 5/2015 |
|---|---|---|
| JP | 2011039920 A | 2/2011 |

(Continued)

OTHER PUBLICATIONS

TW Office Action for Application No. 105130119, dated Nov. 17, 2017, w/ First Office Action Summary.

(Continued)

*Primary Examiner* — Idriss N Alrobaye
*Assistant Examiner* — Dayton Lewis-Taylor
(74) *Attorney, Agent, or Firm* — Nixon Peabody LLP; Zhou Lu

(57) ABSTRACT

A system for chassis management includes a plurality of motherboards of a chassis, a plurality of baseboard management controllers (BMCs), and at least one chassis level component. Each of the plurality of BMCs is associated with one of the plurality of motherboards. The plurality of BMCs are interconnected via a first communication bus. The plurality of BMCs and the at least one chassis level component are interconnected via a second communication bus. One BMC of the plurality of BMCs is configured to operate as a virtual chassis management controller (VCMC) for the chassis. The VCMC is configured to exchange data with other BMCs of the plurality of BMCs over the first communication bus and manage the at least one chassis level component over the second communication bus.

16 Claims, 5 Drawing Sheets

(56) References Cited

U.S. PATENT DOCUMENTS

| | | |
|---|---|---|
| 2013/0254578 A1 | 9/2013 | Haung |
| 2014/0195704 A1 | 7/2014 | Bhatia et al. |
| 2014/0344389 A1* | 11/2014 | Hsieh .................... G06F 13/362 709/208 |
| 2015/0032925 A1 | 1/2015 | Chidester et al. |
| 2015/0178095 A1* | 6/2015 | Balakrishnan ........ G06F 13/364 710/110 |
| 2015/0248315 A1* | 9/2015 | Ragupathi ........... H04L 12/6418 709/226 |
| 2016/0037686 A1 | 2/2016 | Shabbir et al. |
| 2016/0070627 A1 | 3/2016 | Huang et al. |
| 2016/0259661 A1 | 9/2016 | Tasoulas et al. |

FOREIGN PATENT DOCUMENTS

| | | |
|---|---|---|
| JP | 2012123537 A | 6/2012 |
| JP | 2015230720 A | 12/2015 |
| TW | 201222208 A | 6/2012 |
| TW | 201339969 A | 10/2013 |
| TW | 201506613 A | 2/2015 |
| TW | 528134 I | 4/2016 |

OTHER PUBLICATIONS

TW Search Report for Application No. 105130119, (dated Nov. 7, 2017) dated Nov. 17, 2017.

Extended European Search Report for EP Application No. 17170387.9, dated Nov. 23, 2017.

JP Office Action for Application No. 2017-102113, dated Jun. 26, 2018, w/ First Office Action Summary.

Communication pursuant to Article 94(3) EPC for EP Application No. 17170387.9, dated Sep. 28, 2018.

JP Office Action for Application No. 2017-102113, dated Dec. 4, 2018, w/ First Office Action Summary.

\* cited by examiner

VIRTUAL CHASSIS MANAGEMENT CONTROLLER

BACKGROUND

Field

This application relates to computer systems, and more particularly to a system and method for managing a server chassis.

Background

Computer equipment is commonly stored or mounted on server racks in a data center. Each rack can accommodate multiple components in an organized arrangement that makes efficient use of space and places the computer equipment and associated infrastructure within easy reach of a system administrator. Much of the computer equipment in a data center is in the form of servers stored in enclosures stacked in standardized server racks, such as 19 inch rack cabinets.

Server racks mount a number of computing modules, such as trays, chassis, sleds, etc., that are positioned and stacked within. Server racks allow for a vertical arrangement of the computing modules to use space efficiently. A chassis in a server rack commonly includes one or more servers, each managed by a baseboard management controller (BMC). The BMC manages an interface between system management software and platform hardware. Different types of sensors built into the server report to the BMC on parameters such as temperature, cooling fan speeds, power status, operating system status, etc. The BMC monitors the sensors and has the ability to send alerts to an administrator via a network interface if any of the parameters do not stay within preset limits, indicating a potential failure of the system.

Each chassis also includes rack mounted fans, power supply units (PSUs), sensors, network cards, and other such hardware components. Analogous to how each server includes a BMC for managing various server functions, the chassis typically include a chassis management controller (CMC) for managing various chassis functions such as fan control, power management, sensor management, and/or allowing remote management over a network.

SUMMARY

The following presents a simplified summary of one or more embodiments in order to provide a basic understanding of present technology. This summary is not an extensive overview of all contemplated embodiments of the present technology, and is intended to neither identify key or critical elements of all examples nor delineate the scope of any or all aspects of the present technology. Its sole purpose is to present some concepts of one or more examples in a simplified form as a prelude to the more detailed description that is presented later.

An example system for chassis management includes a plurality of motherboards of a chassis, a plurality of baseboard management controllers (BMCs), and at least one chassis level component. Each of the plurality of BMCs is associated with one of the plurality of motherboards. The plurality of BMCs are interconnected via a first communication bus. The plurality of BMCs and the at least one chassis level component are interconnected via a second communication bus. One BMC of the plurality of BMCs is configured to operate as a virtual chassis management controller (VCMC) for the chassis. The VCMC is configured to exchange data with other BMCs of the plurality of BMCs over the first communication bus and manage the at least one chassis level component over the second communication bus.

In some implementations, the system further includes a chassis management controller (CMC), where configuring the one BMC to operate as the VCMC is in response to the CMC malfunctioning. In some implementations, one BMC of the plurality of BMCs is configured as a default VCMC. In some implementations, configuring the one BMC to operate as the VCMC is in response to an administrator selection.

In some implementations, in response to determining the one BMC is not available to operate as the VCMC, another BMC from the plurality of BMCs is configured to operate as the VCMC. In some implementations, the system further includes a general-purpose input/output (GPIO) expander configured to connect the VCMC to one or more chassis level component.

In some implementations, first communication bus is an Intelligent Platform Management Bus (IPMB). In some implementations, the second communication bus is an Inter-Integrated Circuit (I2C) bus. In some implementations, the at least one chassis level component includes at least one of a sensor, a fan, or a power supply unit (PSU).

Another example system for chassis management includes a chassis switch, a plurality of motherboards, a plurality of baseboard management controllers (BMCs), and at least one chassis level component. Each of the plurality of BMCs is associated with one of the plurality of motherboards and coupled to the chassis switch. The plurality of BMCs are interconnected via a first communication bus. The plurality of BMCs and the chassis switch are interconnected via a second communication bus. The at least one chassis level component is coupled to the chassis switch via the second communications bus. The chassis switch is configured to exchange data with the plurality of BMCs and selectively connect each of the at least one chassis level component to one of the plurality of BMCs.

In some implementations, the chassis switch is configured to determine which of the plurality of BMCs to connect to each of the at least one chassis level component. In some implementations, the chassis switch is configured to determine which of the plurality of BMCs to connect to each of the at least one chassis level component based on a priority table. In some implementations, the chassis switch is configured to determine which of the plurality of BMCs to connect to each of the at least one chassis level component based on a classification type for each of the at least one chassis level component.

BRIEF DESCRIPTION OF THE DRAWINGS

These and other sample aspects of the present technology will be described in the detailed description and the appended claims that follow, and in the accompanying drawings, wherein:

DETAILED DESCRIPTION

The subject disclosure provides techniques for managing a server chassis. Various aspects of the present technology are described with reference to the drawings. In the following description, for purposes of explanation, numerous specific details are set forth in order to provide a thorough understanding of one or more aspects. It is evident, however, that the present technology can be practiced without these specific details. In other instances, well-known structures and devices are shown in block diagram form in order to facilitate describing these aspects.

The subject disclosure provides a system and method for managing a server chassis. The server chassis can include a single server with a single motherboard, such as a Blade server or Microserver, or can include multiple servers with multiple motherboards. Each server in the server chassis can be managed by a baseboard management controller (BMC) associated with the motherboard for the server. The subject disclosure provides a virtual chassis management controller to eliminate a need for a separate physical chassis management controller to manage server level components.

Figure 1:
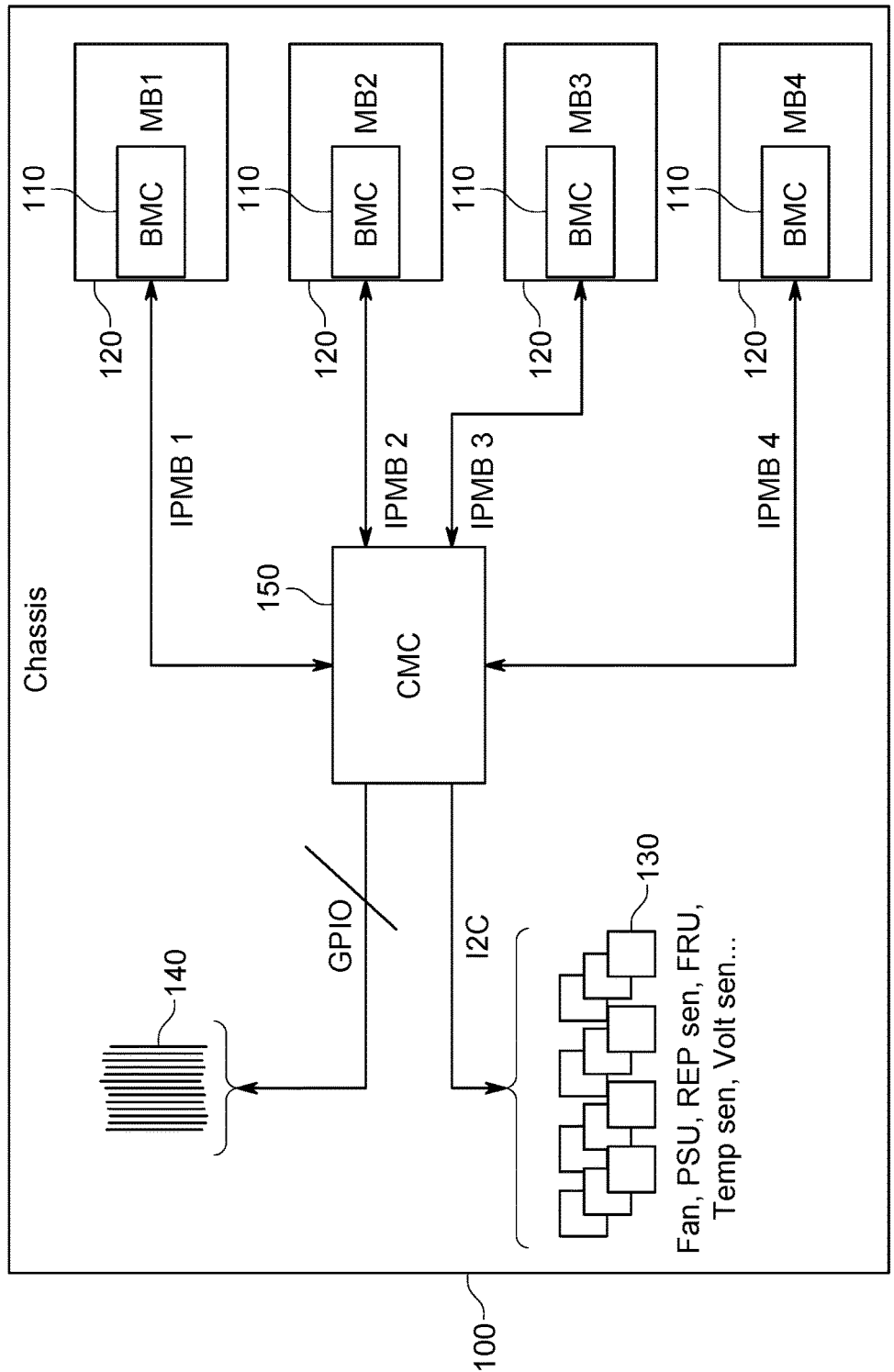
FIG. 1 illustrates a block diagram of a system including a chassis management controller in the prior art.

FIG. 1 illustrates a block diagram of a system 100 including a chassis management controller (CMC) 150 in the prior art. The system 100 includes multiple motherboards 120, a controller 110 associated with each motherboard 120, the CMC 150, and at least one chassis level component 130.

The chassis level components 130 can include devices such as fans, power supply units (PSUs), various sensors (e.g., voltage sensors, current sensors, or temperature sensors) field replaceable units (FRUs), light-emitting diodes (LEDs), etc.

In some implementations, the controller 110 is a baseboard management controller (BMC) or any other controller that performs the functions described herein. The BMC 110 is a controller that manages interfaces between system management software and platform hardware. In some implementations, each BMC 110 can manage hardware components within the server, such as processors, memory, storage devices, PSUs, fans, boards, etc.

The CMC 150 is a microcontroller that communicates with each of the BMCs 110 and manages the chassis level components 130. The CMC 150 generally monitors and ensures the health of equipment in the chassis 100. Each BMC 110 connects to the CMC 120 using an Intelligent Platform Management Bus (IPMB). The CMC 150 connects to the chassis level components via an I2C bus and/or a general-purpose input/output (GPIO) interface 150.

The BMC is a part of an Intelligent Platform Management Interface (IPMI) sub-system, which further includes a non-volatile storage, and other satellite controllers distributed among different system modules. The IPMI sub-system can operate independent of the rest of a server and can function even when the server is powered down or shut off. The IPMI sub-system and a network interface controller (NIC) can operate even on standby power or in a low-power mode while the server is shut down.

The BMC communicates with the various server components that the BMC manages using the IPMI protocol. IPMI is a set of specifications for an autonomous computer subsystem that manages and monitors a computer system's CPU, firmware, and OS, and for out-of-band management and monitoring by system administrators. The BMC can connect to the various server components (e.g., southbridge or NIC) using any bus interface such as the system management bus (SMBus), RS-232 serial bus, I2C protocol, Ethernet, IPMB, low-pin count (LPC) bus, etc. The I2C protocol features a multi-master, multi-slave, single-ended, serial computer bus that uses a Serial Data Line and a Serial Clock Line with a 7-bit or a 10-bit address space. The SMBus protocol features a single-ended, two-wire bus derived from I2C protocol and uses I2C hardware and I2C addressing. The IPMB is an I2C based serial bus for connecting various boards within the server.

Each general-purpose input/output (GPIO) pin is a generic pin on an integrated circuit that has no predefined purpose and are unused by default. GPIO pins can be configured to be input or output, enabled or disabled. The GPIO interface can be used to connect to a wide variety of devices.

The system 100 requires a physical device such as a microcontroller to function as the CMC 150. Such a physical device increases total equipment costs, maintenance costs, and complexity of the system 100. The physical device also causes a delay in management of the chassis-level components 130.

Figure 2:
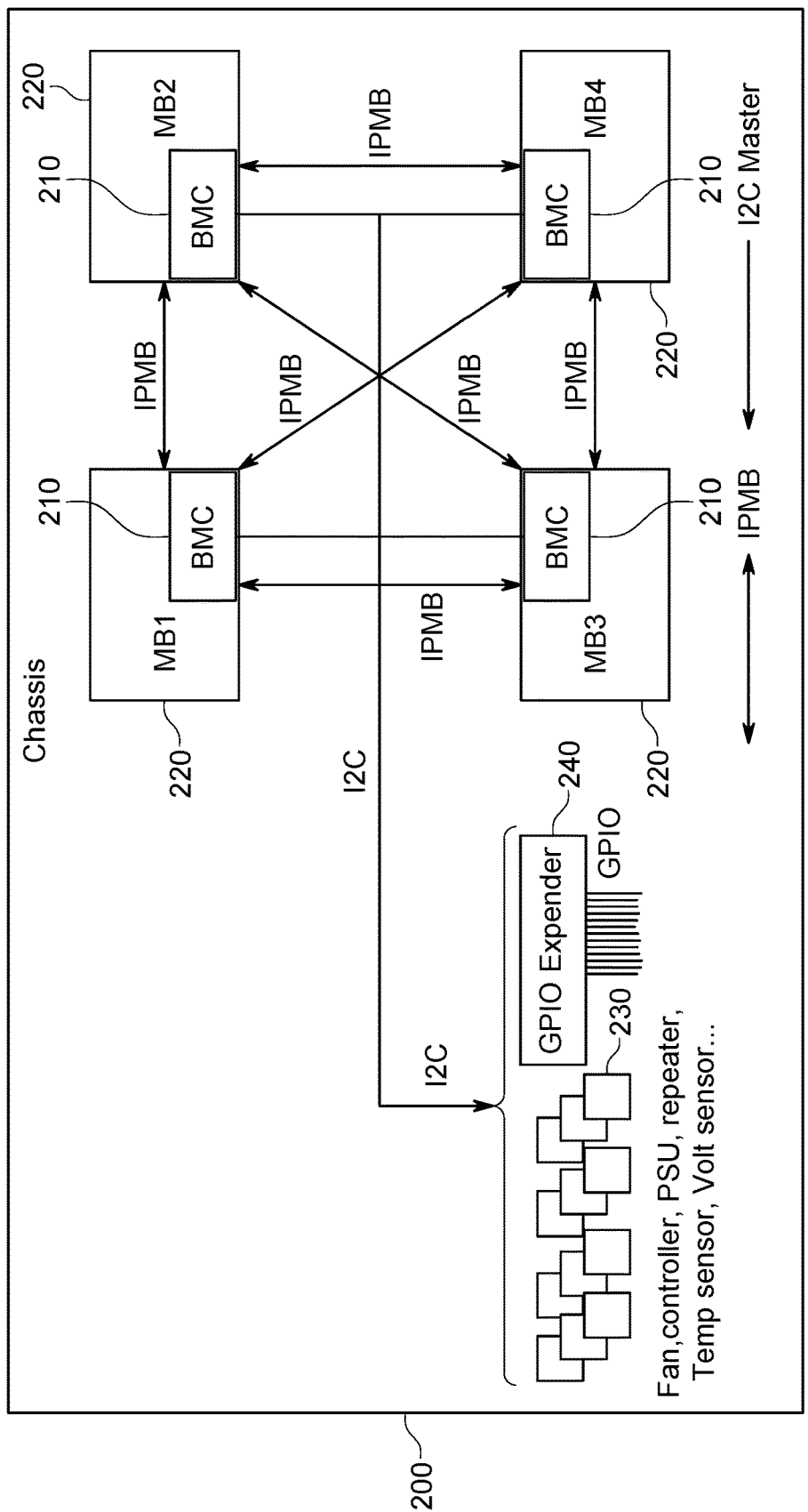
FIG. 2 illustrates a block diagram of a first example system for chassis management.

FIG. 2 illustrates a block diagram of a first example system 200 for chassis management. The system 200 includes a plurality of motherboards 220, a plurality of controllers 210, each associated with one of the motherboards 220, and at least one chassis level component 230.

The chassis level components 230 can include devices such as fans, power supply units (PSUs), various sensors (e.g., voltage sensors, current sensors, or temperature sensors) field replaceable units (FRUs), light-emitting diodes (LEDs), etc.

For example, each controller 210 is a baseboard management controller (BMC) or any other controller that performs the functions described herein. The BMC 210 is a controller that manages interfaces between system management software and platform hardware. In some implementations, each BMC 210 can manage hardware components within the server, such as processors, memory, storage devices, PSUs, fans, boards, etc.

The BMCs 210 are interconnected via a first communication bus. The BMCs 210 and the chassis level components 230 are interconnected via a second communication bus. In some implementations, in the first communication bus is an Intelligent Platform Management Bus (IPMB). In some implementations, the second communication bus is an Inter-Integrated Circuit (I2C) bus.

Unlike the chassis 100 of FIG. 1, the system 200 does not require a CMC 150. Instead, the system 200 leverages the fact that each of BMCs 210 has sufficient computing power to perform the operations of the CMC 150 of FIG. 1. Therefore, one aspect involves configuring one of the BMCs 210 in system 200 to operate as a virtual chassis management controller (VCMC) to perform one or more functions of the CMC 150 of FIG. 1, in addition to standard functions of the BMC 210.

In some implementations, the system 200 includes a CMC, however, in response to the CMC malfunctioning, one of the BMCs 210 is configured to operate as the VCMC.

In some implementations, an administrator selects (i.e., via a command over an in-band or out-of-band network) one of the BMCs as the VCMC. In some implementations, one of the BMCs 210 is preselected as a default VCMC. In some implementations, if one BMC is not available to operate as the VCMC, another BMC from the plurality of BMCs 210 is configured to operate as the VCMC.

The VCMC is configured to exchange data with other BMCs 210 over the first communication bus. The VCMC manages the chassis level components 230 over the second communication bus. The VCMC generally monitors and ensures the health of equipment in the chassis 200. In some implementations, the BMCs 210 are preconfigured during manufacturing to include the functionality of a typical CMC. In some implementations, an administrator installs firmware to the BMCs 210 that allows the BMCs 210 to include the functionality of a typical CMC.

In some implementations, the chassis level components 230 include a GPIO expander 240. The GPIO expander 240 enables the VCMC to use the general-purpose input/output (GPIO) interface 240. The VCMC can connect to the GPIO expander 240 via I2C to various GPIO interface devices.

Figure 3:
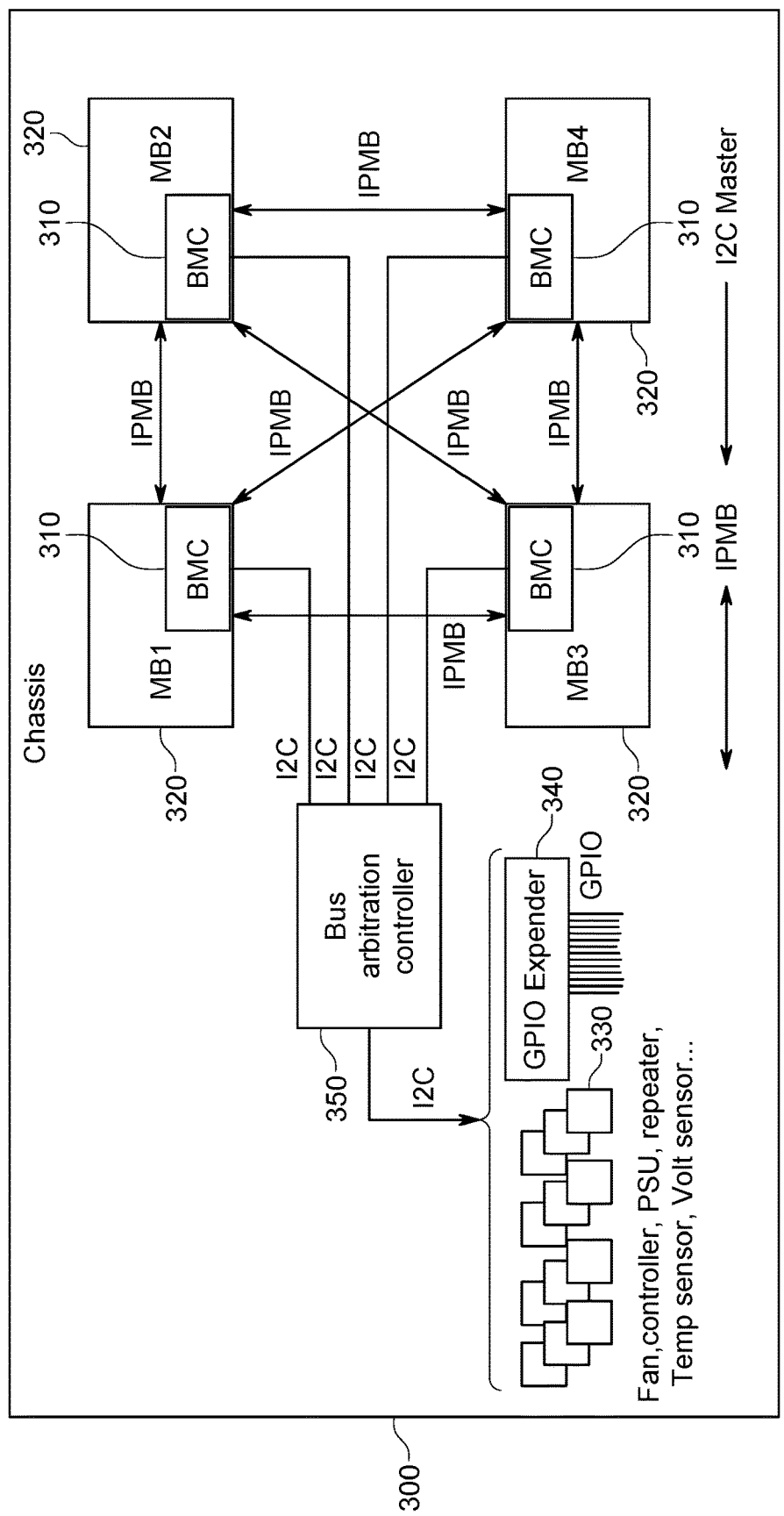
FIG. 3 illustrates an example method for chassis management according to the system of FIG. 2.

FIG. 3 illustrates a block diagram of a second example system 300 for chassis management. The system 300 includes a chassis switch 350, a plurality of motherboards 320, a plurality of controllers 310, each associated with one of the motherboards 320, and at least one chassis level component 330.

The chassis level components 330 can include devices such as fans, power supply units (PSUs), various sensors (e.g., voltage sensors, current sensors, or temperature sensors) field replaceable units (FRUs), light-emitting diodes (LEDs), etc.

For example, each controller 310 can be a baseboard management controller (BMC) or any other controller that performs the functions described herein. The BMC 310 is a controller that manages interfaces between system management software and platform hardware. Each BMC 310 can manage hardware components within the server, such as processors, memory, storage devices, PSUs, fans, boards, etc.

The BMCs 310 are interconnected via a first communication bus. The BMCs 310 and the chassis level components 330 are interconnected through the chassis switch 350 via a second communication bus. In some implementations, in the first communication bus is an Intelligent Platform Management Bus (IPMB). In some implementations, the second communication bus is an Inter-Integrated Circuit (I2C) bus.

Unlike the chassis 100 of FIG. 1, the system 300 does not include a CMC 150. The system 300 instead configures each of the BMCs 310 to perform one or more functions of the CMC 150 of FIG. 1, in addition to standard functions of the BMC 310. The chassis switch 350 is configured to exchange data with the plurality of BMCs and selectively connect each of the at chassis level components 330 to one of the plurality of BMCs.

In some implementations, chassis switch 350 is configured to determine which of the BMCs 310 to connect to each of the chassis level components. For example, each BMC 310 can be assigned to connect to a different set of components from the chassis level components 330.

In some implementations, chassis switch 350 is configured to determine which of the BMCs 310 to connect to each of the chassis level components 330 based on a priority table.

In some implementations, the chassis switch 350 is configured to determine which of the BMCs 310 to connect to each of the chassis level components 330 based on a classification type for each of the chassis level components 330.

In some implementations, the chassis level components 330 include a GPIO expander 340 that enables the BMCs 310 to use the general-purpose input/output (GPIO) interface 340. The GPIO expander 340 can connect the BMCs 310 to various devices that uses GPIO pins.

Figure 4:
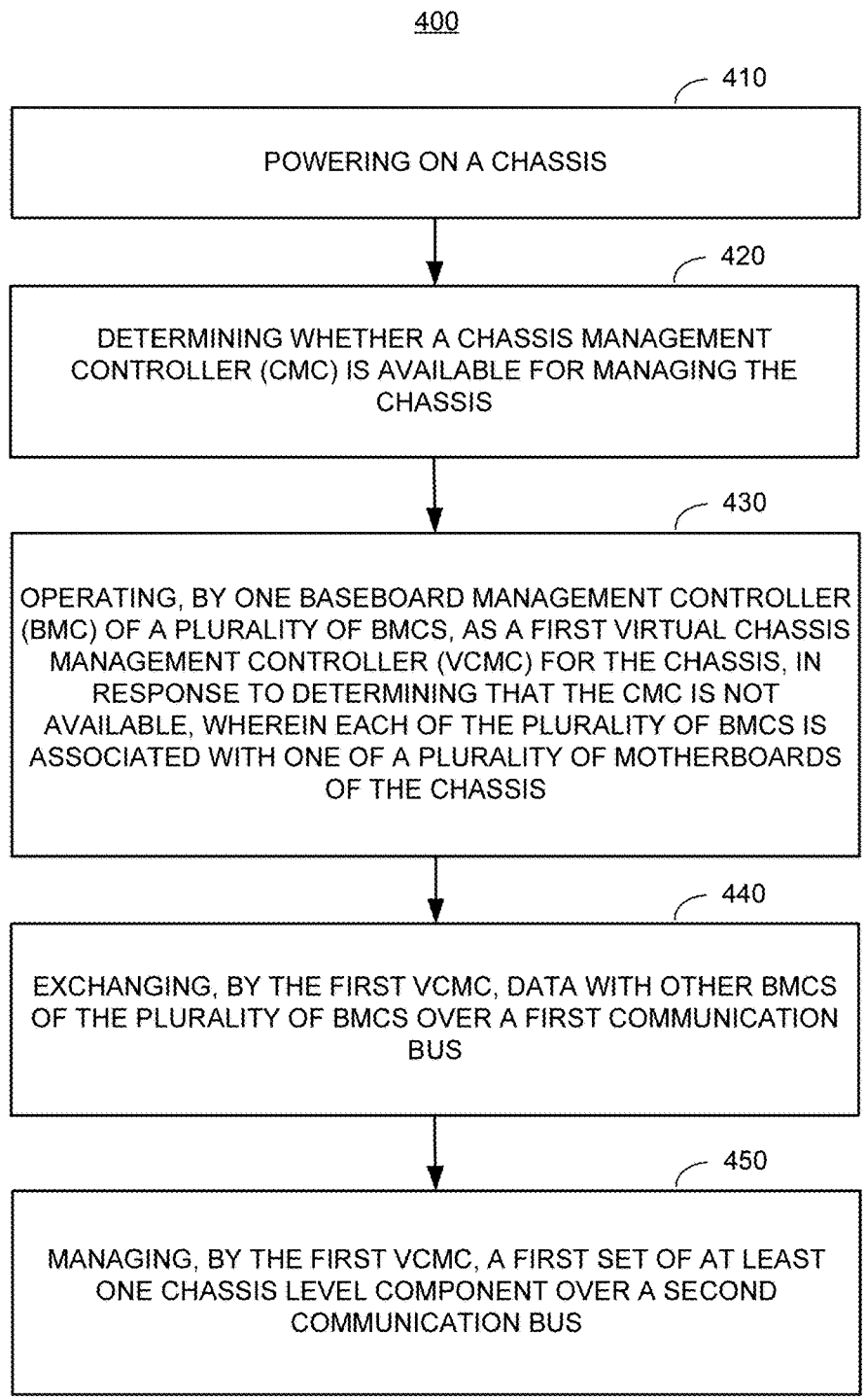
FIG. 4 illustrates a block diagram of a second example system for chassis management.

FIG. 4 illustrates an example method 400 for chassis management according to the system of FIG. 2. At step 410, a chassis is powered on.

At step 420, it is determined whether a chassis management controller (CMC) is available for managing the chassis. For example, a one baseboard management controller (BMC) can determine whether the CMC is available.

At step 430, one baseboard management controller (BMC) of a plurality of BMCs operates as a first virtual chassis management controller (VCMC) for the chassis, in response to determining that the CMC is not available, wherein each of the plurality of BMCs is associated with one of a plurality of motherboards of the chassis.

At step 440, the first VCMC exchanges data with other BMCs of the plurality of BMCs over a first communication bus.

At step 450, the first VCMC manages a first set of at least one chassis level component over a second communication bus.

In some implementations, the method 400 determines whether each of the plurality of BMCs is capable of VCMC functionality. The method 400 determines whether each of the plurality of BMCs is capable of managing the first set of at least one chassis level component. The method 400 selects the one BMC from the plurality of BMCs to operate as the VCMC, based on whether the one BMC is capable of VCMC functionality and managing the first set of at least one chassis level component In some implementations, the method 400 determines whether a chassis switch is available. The method 400 selectively connects, by the chassis switch, the first set of at least one chassis level component to the VCMC, in response to determining that the chassis switch is available. The method 400 selectively connects, by the chassis switch, a second set of at least one chassis level component to a second VCMC.

In some implementations, the chassis switch is connected to the first set of at least one chassis level component, the second set of at least one chassis level component, and the plurality of BMCs via the second communication bus.

Figure 5:
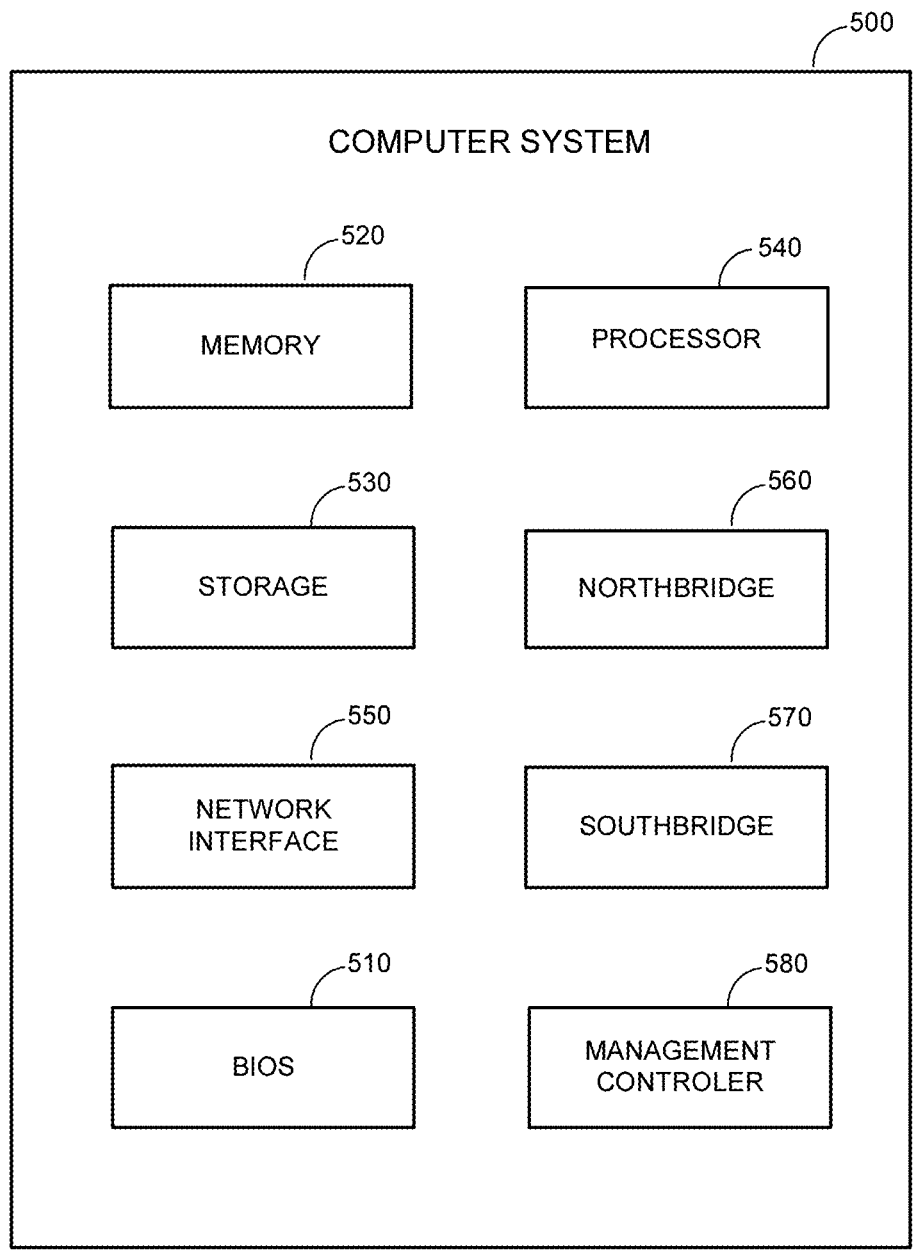
FIG. 5 illustrates an example method for chassis management according to the system of FIG. 4.

In some implementations, the method 400 exchanges, by the second VCMC, data with other BMCs of the plurality of BMCs over the first communication bus. The method 400 manages, by the second VCMC, the second set of at least one chassis level component over the second communication bus FIG. 5 illustrates a block diagram of an example computer system 500. The computer system 500 includes a processor 540, a network interface 550, a management controller 580, a memory 520, a storage 530, a BIOS 510, a northbridge 560, and a southbridge 570.

The computer system 500 is, for example, a server (e.g., a server in a server rack of a data center) or a personal computer. The processor (e.g., central processing unit (CPU)) 540 is a chip on a motherboard that retrieves and executes programming instructions stored in the memory 520. The processor 540 is a single CPU with a single processing core, a single CPU with multiple processing cores, or multiple CPUs. One or more buses (not shown) transmit instructions and application data between various computer components such as the processor 540, memory 520, storage 530, and networking interface 550.

The memory 520 includes any physical device used to temporarily or permanently store data or programs, such as various forms of random-access memory (RAM). The storage 530 includes any physical device for non-volatile data storage such as a HDD or a flash drive. The storage 530 can have a greater capacity than the memory 520 and can be more economical per unit of storage, but can also have slower transfer rates.

The BIOS 510 includes a Basic Input/Output System or its successors or equivalents, such as an Extensible Firmware Interface (EFI) or Unified Extensible Firmware Interface (UEFI). The BIOS 510 includes a BIOS chip located on a motherboard of the computer system 500 storing a BIOS software program. The BIOS 510 stores firmware executed when the computer system is first powered on along with a set of configurations specified for the BIOS 510. The BIOS firmware and BIOS configurations are stored in a non-volatile memory (e.g., NVRAM) or a ROM such as flash memory. Flash memory is a non-volatile computer storage medium that can be electronically erased and reprogrammed.

The BIOS 510 is loaded and executed as a sequence program each time the computer system 500 is started. The BIOS 510 recognizes, initializes, and tests hardware present in a given computing system based on the set of configurations. The BIOS 510 performs self-test, such as a Power-on-Self-Test (POST), on the computer system 500. This self-test tests functionality of various hardware components such as hard disk drives, optical reading devices, cooling devices, memory modules, expansion cards and the like. The BIOS addresses and allocates an area in the memory 520 in to store an operating system. The BIOS 510 then gives control of the computer system to the OS.

The BIOS 510 of the computer system 500 includes a BIOS configuration that defines how the BIOS 510 controls various hardware components in the computer system 500. The BIOS configuration determines the order in which the various hardware components in the computer system 500 are started. The BIOS 510 provides an interface (e.g., BIOS setup utility) that allows a variety of different parameters to be set, which can be different from parameters in a BIOS default configuration. For example, a user (e.g., an administrator) can use the BIOS 510 to specify clock and bus speeds, specify what peripherals are attached to the computer system, specify monitoring of health (e.g., fan speeds and CPU temperature limits), and specify a variety of other parameters that affect overall performance and power usage of the computer system.

The management controller 580 is a specialized controller embedded on the motherboard of the computer system. For example, the management controller 580 is a baseboard management controller (BMC). The management controller 580 manages the interface between system management software and platform hardware. Different types of sensors built into the computer system report to the management controller 580 on parameters such as temperature, cooling fan speeds, power status, operating system status, etc. The management controller 580 monitors the sensors and has the ability to send alerts to an administrator via the network interface 550 if any of the parameters do not stay within preset limits, indicating a potential failure of the system. The administrator can remotely communicate with the management controller 580 to take some corrective action such as resetting or power cycling the system to restore functionality.

The northbridge 560 is a chip on the motherboard that can be directly connected to the processor 540 or is integrated into the processor 540. In some instances, the northbridge 560 and the southbridge 570 is combined into a single die. The northbridge 560 and the southbridge 570, manage communications between the processor 540 and other parts of the motherboard. The northbridge 560 manages tasks that require higher performance than the southbridge 570. The northbridge 560 manages communications between the processor 540, the memory 520, and video controllers (not shown). In some instances, the northbridge 560 includes a video controller.

The southbridge 570 is a chip on the motherboard connected to the northbridge 560, but unlike the northbridge 560, need not be directly connected to the processor 540. The southbridge 570 manages input/output functions, such as Universal Serial Bus (USB), audio, serial, BIOS, Serial Advanced Technology Attachment (SATA), Peripheral Component Interconnect (PCI) bus, PCI eXtended (PCI-X) bus, PCI Express bus, ISA bus, SPI bus, eSPI bus, SMBus, of the computer system 500. The southbridge 570 connects to or includes within the southbridge 570 the management controller 570, Direct Memory Access (DMAs) controllers, Programmable Interrupt Controllers (PICs), and a real-time clock. In some instances, the southbridge 570 directly connects to the processor 540, such as in the case where the northbridge 560 is integrated into the processor 540. In some systems, the northbridge 560 and the southbridge 570 can be combined into a single die, such as for example into a platform controller hub (PCH).

The networking interface 550 is any interface that supports wired or wireless Local Area Networks (LANs) or Wide Area Networks (WANs), such as Ethernet, Fibre Channel, Wi-Fi, Bluetooth, Firewire, the Internet, etc. For example, the networking interface 550 can include a network interface controller (NIC) for Ethernet. Ethernet has been the most widely used networking standard for connecting computers in both Local Area Networks (LANs) and Wide Area Networks (WANs). Ethernet defines a number of wiring and signaling standards for the physical layer (PHY), through means of network access at the Media Access Control (MAC)/Data Link Layer, and through a common addressing format. Ethernet enabled devices typically communicate by transmitting data packets, which comprise blocks of data that are individually sent and delivered.

The various illustrative logical blocks, modules, and circuits described in connection with the disclosure herein can be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor is a microprocessor, or in the alternative, any conventional processor, controller, controller, or state machine. A processor can also be implemented as a combination of computing devices, e.g., a combination of a DSP and a microprocessor, a plurality of microprocessors, one or more microprocessors in conjunction with a DSP core, or any other such configuration.

The operations of a method or algorithm described in connection with the disclosure herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor reads information from, and write information to, the storage medium. In the alternative, the storage medium is integral to the processor. The processor and the storage medium resides in an ASIC. The ASIC resides in a user terminal. In the alternative, the processor and the storage medium resides as discrete components in a user terminal.

In one or more exemplary designs, the functions described is implemented in hardware, software, firmware, or any combination thereof. If implemented in software, the functions are stored on or transmitted over as one or more instructions or code on a non-transitory computer-readable medium. Non-transitory computer-readable media includes both computer storage media and communication media including any medium that facilitates transfer of a computer program from one place to another. A storage media is any available media that can be accessed by a general purpose or special purpose computer. By way of example, and not limitation, such computer-readable media includes RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Disk and disc, as used herein, includes compact disc (CD), laser disc, optical disc, digital versatile disc (DVD), floppy disk and blue ray disc where disks usually reproduce data magnetically, while discs reproduce data optically with lasers. Combinations of the above should also be included within the scope of non-transitory computer-readable media. In each instance where a computer-readable storage device is referenced, such a computer-readable storage device excludes transitory signals per se.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

The invention claimed is:

1. A system for chassis management, comprising:
a plurality of motherboards of a chassis;
a plurality of baseboard management controllers (BMCs), each of the plurality of BMCs associated with one of the plurality of motherboards; and
at least one chassis level component coupled to a chassis switch,
wherein the plurality of BMCs are directly interconnected via a first type of communication bus, wherein the plurality of BMCs and the at least one chassis level component are interconnected via a second type of communication bus, and
wherein one BMC of the plurality of BMCs is configured to operate as a virtual chassis management controller (VCMC) for the chassis, the VCMC configured to exchange data with other BMCs of the plurality of BMCs over the first type of communication bus and manage the at least one chassis level component over the second type of communication bus,
wherein the chassis switch is configured to determine which of the plurality of BMCs to connect to each of the at least one chassis level component,
wherein the chassis switch is configured to determine which of the plurality of BMCs to connect to each of the at least one chassis level component based on a schedule, a priority table, or a classification type for each of the at least one chassis level component.

2. The system of claim 1, further comprising a chassis management controller (CMC), wherein configuring the one BMC to operate as the VCMC is in response to the CMC malfunctioning.

3. The system of claim 1, wherein the one BMC of the plurality of BMCs is configured as a default VCMC.

4. The system of claim 1, wherein configuring the one BMC to operate as the VCMC is in response to an administrator selection.

5. The system of claim 1, wherein in response to determining the one BMC is not available to operate as the VCMC, another BMC from the plurality of BMCs is configured to operate as the VCMC.

6. The system of claim 1, wherein in the first type of communication bus is an Intelligent Platform Management Bus (IPMB).

7. The system of claim 1, wherein in the second type of communication bus is an Inter-Integrated Circuit (I2C) bus.

8. The system of claim 1, further comprising a general-purpose input/output (GPIO) expander configured to connect the VCMC to one or more chassis level component.

9. The system of claim 1, wherein the at least one chassis level component includes at least one of a sensor, a fan, or a power supply unit (PSU).

10. A system for chassis management, comprising:
a chassis switch;
a plurality of motherboards;
a plurality of baseboard management controllers (BMCs), each of the plurality of BMCs associated with one of the plurality of motherboards and coupled to the chassis switch, wherein the plurality of BMCs are directly interconnected via a first type of communication bus, wherein the plurality of BMCs and the chassis switch are interconnected via a second type of communication bus; and
at least one chassis level component coupled to the chassis switch via the second communications bus, wherein the chassis switch is configured to exchange data with the plurality of BMCs and selectively connect each of the at least one chassis level component to one of the plurality of BMCs,
wherein the chassis switch is configured to determine which of the plurality of BMCs to connect to each of the at least one chassis level component,
wherein the chassis switch is configured to determine which of the plurality of BMCs to connect to each of the at least one chassis level component based on a schedule, a priority table, or a classification type for each of the at least one chassis level component.

11. The system of claim 10, wherein the at least one chassis level component includes at least one of a sensor, a fan, or a power supply unit (PSU).

12. A method for chassis management, comprising:
powering on a chassis;
determining whether a chassis management controller (CMC) is available for managing the chassis;
operating, by one baseboard management controller (BMC) of a plurality of BMCs, as a first virtual chassis management controller (VCMC) for the chassis, in response to determining that the CMC is not available, wherein each of the plurality of BMCs is associated with one of a plurality of motherboards of the chassis, and wherein the plurality of BMCs are directly interconnected;

exchanging, by the first VCMC, data with other BMCs of the plurality of BMCs over a first type of communication bus; and managing, by the first VCMC, a first set of at least one chassis level component over a second type of communication bus, the at least one chassis level component being coupled to a chassis switch, wherein the chassis switch is configured to determine which of the plurality of BMCs to connect to each of the at least one chassis level component, wherein the chassis switch is configured to determine which of the plurality of BMCs to connect to each of the at least one chassis level component based on a schedule, a priority table, or a classification type for each of the at least one chassis level component.

13. The method of claim 12, further comprising:

determining whether each of the plurality of BMCs is capable of VCMC functionality;

determining whether each of the plurality of BMCs is capable of managing the first set of at least one chassis level component; and selecting the one BMC from the plurality of BMCs to operate as the VCMC, based on whether the one BMC is capable of VCMC functionality and managing the first set of at least one chassis level component.

14. The method of claim 12, further comprising:

selectively connecting, by the chassis switch, the first set of at least one chassis level component to the VCMC, in response to determining that the chassis switch is available; and selectively connecting, by the chassis switch, a second set of at least one chassis level component to a second VCMC.

15. The method of claim 14, wherein the chassis switch is connected to the first set of at least one chassis level component, the second set of at least one chassis level component, and the plurality of BMCs via the second type of communication bus.

16. The method of claim 14, further comprising:

exchanging, by the second VCMC, data with other BMCs of the plurality of BMCs over the first type of communication bus; and managing, by the second VCMC, the second set of at least one chassis level component over the second type of communication bus.

\* \* \* \* \*